(12) United States Patent
Koike et al.

(10) Patent No.: US 7,220,975 B2
(45) Date of Patent: May 22, 2007

(54) MASK-MAKING MEMBER AND ITS PRODUCTION METHOD, MASK AND ITS MAKING METHOD, EXPOSURE PROCESS, AND FABRICATION METHOD OF SEMICONDUCTOR DEVICE

(75) Inventors: Kaoru Koike, Kanagawa (JP); Shigeru Moriya, Kanagawa (JP)

(73) Assignee: Sony Corporation, Tokyo (JP)

( * ) Notice: Subject to any disclaimer, the term of this patent is extended or adjusted under 35 U.S.C. 154(b) by 774 days.

(21) Appl. No.: 10/080,104

(22) Filed: Feb. 21, 2002

(65) Prior Publication Data

US 2002/0130425 A1 Sep. 19, 2002

(30) Foreign Application Priority Data

Feb. 22, 2001 (JP) ............................. P2001-046363

(51) Int. Cl.
*H01J 37/304* (2006.01)
*H01J 37/153* (2006.01)
*H01L 23/544* (2006.01)

(52) U.S. Cl. ............................ 250/491.1; 250/492.2; 257/797; 257/798; 438/401; 438/462; 438/975; 430/5; 430/492; 430/22; 355/53

(58) Field of Classification Search ................ 257/797, 257/796, 798; 430/22, 23; 355/57; 356/399, 356/401
See application file for complete search history.

(56) References Cited

U.S. PATENT DOCUMENTS

| | | | | |
|---|---|---|---|---|
| 4,849,313 A | * | 7/1989 | Chapman et al. .............. 430/5 |
| 5,231,471 A | * | 7/1993 | Torigoe ....................... 356/401 |
| 5,319,444 A | * | 6/1994 | Saitoh et al. ............... 356/401 |
| 5,464,715 A | * | 11/1995 | Nishi et al. .................... 430/22 |
| 5,695,897 A | * | 12/1997 | Mitome et al. ............... 430/22 |
| 5,715,037 A | * | 2/1998 | Saiki et al. .................... 355/53 |
| 5,939,132 A | * | 8/1999 | Fujii et al. ................... 438/462 |
| 6,151,120 A | * | 11/2000 | Matsumoto et al. ........ 356/399 |
| 6,204,509 B1 | * | 3/2001 | Yahiro et al. ............. 250/491.1 |
| 6,265,119 B1 | * | 7/2001 | Magome ....................... 430/30 |
| 6,641,962 B2 | * | 11/2003 | Mizutani et al. .............. 430/22 |

* cited by examiner

*Primary Examiner*—Evan Pert
*Assistant Examiner*—Fazli Erdem
(74) *Attorney, Agent, or Firm*—Sonnenschein Nath & Rosenthal LLP

(57) ABSTRACT

A mask blank has a plurality of pattern formation regions in which mask circuit patterns are to be formed, and a supporting region in which any mask circuit pattern is not to be formed. The supporting region is provided for holding the plurality of pattern formation regions while separating the plurality of pattern formation regions from each other. The supporting region has first and second alignment marks. Exposure of a mask made from the mask blank for forming mask circuit patterns thereon is performed on the basis of the first alignment marks, and exposure of a substrate for forming circuit patterns thereon is performed on the basis of the second alignment marks. With this configuration, a mask used for charged particle beam reduction-and-division transfer exposure can be highly accurately produced at a low cost, and exposure of a substrate can be highly accurately performed by using the mask.

44 Claims, 11 Drawing Sheets

REGION IN WHICH MASK CIRCUIT PATTERN IS TO BE FORMED

TRANSFER BOUNDARY

TRANSFER BOUNDARY

TRANSFER BOUNDARY

TRANSFER BOUNDARY

MASK-MAKING MEMBER AND ITS PRODUCTION METHOD, MASK AND ITS MAKING METHOD, EXPOSURE PROCESS, AND FABRICATION METHOD OF SEMICONDUCTOR DEVICE

RELATED APPLICATION DATA

The present application claims priority to Japanese Application(s) No(s). P2001-046363 filed Feb. 22, 2001, which application(s) is/are incorporated herein by reference to the extent permitted by law.

BACKGROUND OF THE INVENTION

The present invention relates to a member for making a mask and a method of producing the mask-making member, a mask made from the mask-making member and a method of making the mask made from the mask-making member, an exposure process using the mask, and a method of fabricating a semiconductor device using the mask. In particular, the present invention relates to a technique suitable for exposure of a substrate such as a wafer to charged particle beams, typically, electron beams.

Semiconductor integrated circuit devices, liquid crystal display units, CCD devices, and the like have been fabricated by using a fine processing technique for semiconductors. Along with the increased degree of integration of these semiconductor devices, circuit patterns formed thereon have become finer, and to form such finer circuit patterns, exposure by charged particle beams, particularly, electron beams have become a focus of attention. An electron beam exposure process is effective to form finer circuit patterns; however, it has a disadvantage that a throughput (amount treated per unit time) is low. To improve such a throughput, there have been practically used two kinds of electron beam exposure systems: a variable shaped beam exposure system in which electron beams are deflected between two beam forming masks to be shaped into a desired size of about 5 µm at maximum, and a block full exposure system in which a circuit pattern portion is formed in a lower one of two beam forming masks, wherein a plurality of character patterns are formed by exposure at one beam shot. An electron beam exposure system, composed of a combination of the variable shaped beam exposure system and the block full exposure system, has been already commercially available. In the case of forming the recent highly integrated circuit patterns by exposure, however, this block full exposure system is yet significantly low in throughput than the existing exposure system using light.

To solve the problem associated with throughput of the electron beam exposure system, an electron beam reduction transfer exposure system has been disclosed, for example, in Japanese Patent Laid-open No. Hei 5-160012, wherein a mask having a circuit pattern for the whole of one integrated circuit chip is irradiated with electron beams, so that an image of a portion, within the irradiated range, of the circuit pattern is transferred at a specific reduction ratio, for example, 1/4 through a projection lens. In this electron beam reduction transfer exposure system, however, if the entire mask equivalent to the whole of the integrated circuit chip is full irradiated with electron beams, there may occurs an inconvenience that the circuit pattern cannot accurately transferred by exposure. To cope with such an inconvenience, an electron beam reduction-and-division transfer exposure system has been disclosed, for example, in Japanese Patent Laid-open No. Hei 5-251317, wherein a field of view of an electron-optical system and a circuit pattern on a mask are divided into a plurality of regions, and the divided parts of the pattern are sequentially formed on a wafer by sequential exposure in such a manner as to be stitched into an accurate circuit pattern for the whole of one integrated circuit chip.

The electron beam reduction-and-division transfer exposure system makes it possible to obtain a high resolution and a high throughput; however, it requires a high resolution mask formed at a high accuracy. For a mask of a reduction ratio of 1/4 used for the electron beam reduction-and-division transfer exposure system, the reduction ratio is substantially the same as that of a mask used for an exposure system using light. If a mask exposure system for making a mask, which mask is used for the electron beam reduction-and-division transfer exposure system of a reduction ratio of 1/4, is required to have a performance comparable to that required for the corresponding mask exposure system using light, a significantly expensive mask exposure system must be used as the above mask exposure system for making a mask by using electron beams. Further, to attain highly accurately exposure over the entire surface of a mask, various kinds of correction are required to be performed during exposure, resulting in the degraded throughput.

To obtain a high positional accuracy on a mask, a method of making a highly accurate mask has been disclosed, for example, in Japanese Patent Laid-open No. Hei 11-38599, wherein position detecting marks are formed on the entire surface of a mask board, and positional correction is performed by using the position detecting marks at the time of forming a circuit pattern on the mask board by exposure. This method, however, has problems that a throughput is low, and that a pattern forming system excellent in long-dimension accuracy has been not obtained yet at the present time.

Another problem of the electron beam reduction-and-division transfer exposure system is as follows: namely, although any exposure system is designed to transfer a circuit pattern formed on a mask onto a substrate as accurately as possible, there may occur a slight deviation in transfer between one and another of the exposure systems depending on assembling accuracy of each of the exposure systems. An electron beam direct wiring type exposure system such as a variable shaped beam exposure system or a block full exposure system can correct such a deviation at any time by adjusting an electron-optical system while monitoring a condition of the exposure system; however, the transfer exposure system is difficult to correct an electron-optical system at any time because it transfers a circuit pattern on a mask on a substrate at a time.

SUMMARY OF THE INVENTION

An object of the present invention is to provide a mask-making member capable of highly accurately making a mask for a charged particle beam reduction-and-division transfer exposure system at a low cost and a method of producing the mask-making member, a mask made from the mask-making member and a method of making the mask made from the mask-making member, an exposure process using the mask, and a method of fabricating a semiconductor device using the mask.

The present inventor has earnestly examined to solve the above-described problems of the related art electron beam exposure systems, and found that the following two measures are effective to solve the above problems.

One of the measures is characterized by forming alignment marks used for exposure of a mask for forming mask circuit pattern on the mask and alignment marks used for exposure of a substrate such as a wafer for forming a circuit pattern on the substrate, on a mask-making member (mask blank) before formation of the mask circuit pattern by exposure, and performing exposure of the mask for forming the mask circuit pattern thereon by using the alignment marks used for exposure of the mask.

The other of the measures is characterized by performing exposure of a substrate for dividedly transferring a positional accuracy detecting pattern on a positional accuracy measuring test mask onto the substrate, detecting a deviation and a distortion of each of an electron-optical system and a stage mechanism system of an electron beam reduction-and-division transfer exposure system on the basis of the transferred pattern circuit, and performing exposure of the mask for forming a mask circuit pattern thereon while correcting the deviation and distortion on the basis of the detected results.

The present invention has been accomplished on the basis of the above-described two measures.

To achieve the above object, according to a first invention, there is provided a mask-making member including:

a plurality of pattern formation regions in which mask circuit patterns are to be formed; and a supporting region in which any mask circuit pattern is not to be formed, the supporting region being provided for holding the plurality of pattern formation regions while separating the plurality of pattern formation regions from each other;

wherein the supporting region has first alignment marks used at the time of exposure of a mask made from the mask-making member for forming the mask circuit patterns thereon, and second alignment marks used at the time of exposure of a substrate to be exposed for forming circuit patterns thereon.

According to a second invention, there is provided a method of producing a mask-making member, which member has a plurality of pattern formation regions in which mask circuit patterns are to be formed, and a supporting region in which any mask circuit pattern is not to be formed, the supporting region being provided for holding the plurality of pattern formation regions while separating the plurality of pattern formation regions from each other, wherein the supporting region has first alignment marks used at the time of exposure of a mask made from the mask-making member for forming the mask circuit patterns thereon, and second alignment marks used at the time of exposure of a substrate to be exposed for forming circuit patterns thereon, the method including the step of:

forming all of the first alignment marks and the second alignment marks on the mask-making member at a time.

According to a third invention, there is provided a method of producing a mask-making member, which member has a plurality of pattern formation regions in which mask circuit patterns are to be formed, and a supporting region in which any mask circuit pattern is not to be formed, the supporting region being provided for holding the plurality of pattern formation regions while separating the plurality of pattern formation regions from each other, wherein the supporting region has first alignment marks used at the time of exposure of a mask made from the mask-making member for forming the mask circuit patterns thereon, and second alignment marks used at the time of exposure of a substrate to be exposed for forming circuit patterns thereon, the method including the steps of:

dividing all of the first alignment marks and the second alignment marks to be formed on the mask-making member into a plurality of groups each containing pluralities of the first alignment marks and the second alignment marks; and sequentially forming the first alignment marks and the second alignment marks on the mask-making member by sequential exposure performed for each of the pluralities of groups.

According to a fourth invention, there is provided a mask including:

a plurality of pattern formation regions in which mask circuit patterns are formed; and a supporting region in which any mask circuit pattern is not formed, the supporting region being provided for holding the plurality of pattern formation regions while separating the plurality of pattern formation regions from each other;

wherein the supporting region has first alignment marks used at the time of exposure of the mask for forming the mask circuit patterns thereon, and second alignment marks used at the time of exposure of a substrate to be exposed for forming circuit patterns thereon.

According to a fifth invention, there is provided a method of making a mask, which mask has a plurality of pattern formation regions in which mask circuit patterns are formed, and a supporting region in which any mask circuit pattern is not formed, the supporting region being provided for holding the plurality of pattern formation regions while separating the plurality of pattern formation regions from each other, wherein the supporting region has first alignment marks used at the time of exposure of the mask for forming the mask circuit patterns thereon, and second alignment marks used at the time of exposure of a substrate to be exposed for forming circuit patterns thereon, the method including the step of:

forming all of the first alignment marks and the second alignment marks on the mask at a time.

According to a sixth invention, there is provided a method of making a mask, which mask has a plurality of pattern formation regions in which mask circuit patterns are formed, and a supporting region in which any mask circuit pattern is not formed, the supporting region being provided for holding the plurality of pattern formation regions while separating the plurality of pattern formation regions from each other, wherein the supporting region has first alignment marks used at the time of exposure of the mask for forming the mask circuit patterns thereon, and second alignment marks used at the time of exposure of a substrate to be exposed for forming circuit patterns thereon, the method including the step of:

dividing all of the first alignment marks and the second alignment marks to be formed on the mask into a plurality of groups each containing pluralities of the first alignment marks and the second alignment marks; and sequentially forming the first alignment marks and the second alignment marks on the mask by sequential exposure performed for each of the pluralities of groups.

In the above sixth invention, preferably, each relative distance between two of the plurality of groups is obtained by measuring each relative distance between the first alignment marks located in the two of the plurality of groups and each relative distance between the second alignment marks located in the two of the plurality of groups, and the exposure by the charged particle beams for forming the mask circuit-patterns on the plurality of regions is performed by using the first alignment marks corrected on the basis of the measured results.

According to a seventh invention, there is provided a method of making a mask, which mask has a plurality of pattern formation regions in which mask circuit patterns are formed, and a supporting region in which any mask circuit pattern is not formed, the supporting region being provided for holding the plurality of pattern formation regions while separating the plurality of pattern formation regions from each other, wherein the supporting region has first alignment marks used at the time of exposure of the mask for forming the mask circuit patterns thereon, and second alignment marks used at the time of exposure of a substrate to be exposed for forming circuit patterns thereon, and the second alignment marks are used for exposure of a substrate to be exposed by a charged particle beam reduction-and-division transfer exposure system by using the second alignment marks, the method including the steps of:

performing exposure of a substrate to be exposed by the charged particle beam reduction-and-division transfer exposure system by using a test mask having a positional deviation measurement pattern, to dividedly transfer the positional deviation measurement pattern on the substrate at a specific reduction ratio;

obtaining a positional deviation amount of the charged particle beam reduction-and-division transfer exposure system upon exposure and a correction amount for correcting the positional deviation amount by using the positional deviation measurement pattern which has been dividedly transferred on the substrate at the specific reduction ratio; and performing exposure of the mask for forming the mask circuit patterns while correcting the mask circuit patterns by the correction amount for the positional deviation so as to correct the positional deviation of the charged particle beam reduction-and-division transfer exposure system, to thereby correct the mask.

According to an eighth invention, there is provided an exposure process including the steps of:

producing a mask having a plurality of pattern formation regions in which mask circuit patterns are formed, and a supporting region in which any mask circuit pattern is not formed, the supporting region being provided for holding the plurality of pattern formation regions while separating the plurality of pattern formation regions from each other, wherein the supporting region has first alignment marks used at the time of exposure of the mask for forming the mask circuit patterns thereon, and second alignment marks used at the time of exposure of a substrate to be exposed for forming circuit patterns thereon; and exposing a substrate to be exposed to charged particle beams by using the second alignment marks formed on the mask.

According to a ninth invention, there is provided an exposure process including the steps of:

producing a mask having a plurality of pattern formation regions in which mask circuit patterns are formed, and a supporting region in which any mask circuit pattern is not formed, the supporting region being provided for holding the plurality of pattern formation regions while separating the plurality of pattern formation regions from each other, wherein the supporting region has first alignment marks used at the time of exposure of the mask for forming the mask circuit patterns thereon, and second alignment marks used at the time of exposure of a substrate to be exposed for forming circuit patterns thereon; and performing exposure of a substrate to be exposed by a charged particle beam reduction-and-division transfer exposure system using the second alignment marks formed on the mask;

wherein a substrate to be exposed is exposed by the charged particle beam reduction-and-division transfer exposure system by using a test mask having a positional deviation measurement pattern, to dividedly transfer the positional deviation measurement pattern on the substrate at a specific reduction ratio;

a positional deviation amount of the charged particle beam reduction-and-division transfer exposure system upon exposure and a correction amount for correcting the positional deviation amount are obtained by using the positional deviation measurement pattern which has been dividedly transferred on the substrate at the specific reduction ratio;

exposure of the mask for forming the mask circuit patterns thereon while correcting the mask circuit patterns by the correction amount for the positional deviation is performed so as to correct the positional deviation of the charged particle beam reduction-and-division transfer exposure system, to thereby correct the mask; and exposure of a substrate to be exposed by the charged particle beam reduction-and-division transfer exposure system is performed by using the corrected mask.

In particular, in the case of using a plurality of charged particle beam reduction-and-division transfer exposure systems for exposure of a substrate such as a wafer, the exposure is preferably performed in the following procedures. A substrate to be exposed is exposed by each of a plurality of charged particle beam reduction-and-division transfer exposure systems by using the same test mask having a positional deviation measurement pattern, to dividedly transfer the positional deviation measurement pattern on the substrate at a specific reduction ratio; a positional deviation amount of each of the plurality of charged particle beam reduction-and-division transfer exposure systems upon exposure and a correction amount for correcting the positional deviation amount are obtained by using the positional deviation measurement pattern which has been dividedly transferred on the substrate at the specific reduction ratio; exposure of the mask for forming the mask circuit patterns thereon while correcting the mask circuit patterns by the correction amount for the positional deviation is performed so as to correct the positional deviation of each of the plurality of charged particle beam reduction-and-division transfer exposure systems, to thereby correct the mask for each of the plurality of charged particle beam reduction-and-division transfer exposure systems; and exposure of a substrate to be exposed is performed by the plurality of charged particle beam reduction-and-division transfer exposure systems using the corrected masks.

According to tenth invention, there is provided a method of fabricating a semiconductor device including:

a plurality of exposure steps in each of which exposure of a semiconductor substrate is performed by a charged particle beam reduction-and-division transfer exposure system using a plurality of masks, each of the masks having a plurality of pattern formation regions in which mask circuit patterns are formed, and a supporting region in which any mask circuit pattern is not formed, the supporting region being provided for holding the plurality of pattern formation regions while separating the plurality of pattern formation regions from each other, wherein the supporting region has first alignment marks used at the time of exposure of the mask for forming the mask circuit patterns thereon, and second alignment marks used at the time of exposure of a substrate to be exposed for forming circuit patterns thereon;

wherein the first alignment marks and the second alignment marks are formed on each of the plurality of masks used for the plurality of exposure steps by using the same master mask.

In these inventions, preferably, the first alignment marks are formed in such a manner that one or more of the first alignment marks are located in a portion, around each of the plurality of pattern formation regions, of the supporting region, and the second alignment marks are formed in such a manner as to be all located in a portion, outside an area formed by the plurality of the pattern formation regions, of the supporting region. Shapes of the first alignment marks are preferably different from those of the second alignment marks. The mask may be either a transmission mask or a stencil mask For the transmission mask, preferably, the first alignment marks and the second alignment marks are formed on an electron scatterer formed on a membrane, particularly, by selectively removing the electron scatterer. For the stencil mask, preferably, the first alignment marks and the second alignment marks are formed on a mask board, particularly, by selectively removing the mask board. In order to improve a mark detection accuracy, preferably, the first alignment marks and the second alignment marks are formed on a mask board by selectively removing the mask board to form holes or grooves in the mask board, and burying the holes or grooves with a metal whose atoms have atomic weights heavier than those of atoms of the mask board. The metal may be platinum, gold, silver, copper, tungsten, tantalum, or molybdenum.

The exposure for forming the first alignment marks and the second alignment marks at a time is preferably performed by using a stepper type exposure system with a projected magnification of a 1:1 ratio or a low reduction ratio, a scanner type exposure system with a projected magnification of a 1:1 ratio or a low reduction ratio, a contact type full exposure system, a proximity type full exposure system, or a mirror-projection type full exposure system.

The exposure of the pattern formation regions is preferably performed by using a charged particle beam exposure system configured such that the charged particle beam has a size of 10 μm or less and a maximum deflection width of the charged particle beam in a state that a stage on which an electron-optical system is mounted is not moved is larger than a total of a width of each of the plurality of pattern formation regions and a width of a portion, between two of the plurality of pattern formation regions, of the supporting region. After exposure by charged particle beams for forming the mask circuit patterns, the mask circuit patterns are formed by development of a resist, followed by etching. In this case, before etching, the first alignment marks and the second alignment marks are preferably covered with a protective film in order to prevent the marks from being damaged or broken in the etching step.

According to the inventions configured as described above, since the first alignment marks are formed by exposure at a time in the supporting region of the mask-making member and exposure of the mask for forming the mask circuit patterns thereon is performed by using the first alignment marks, the positional accuracy of the whole of the mask circuit patterns due to the first alignment marks can be significantly enhanced. Further, the distance between two of the first alignment marks on one mask is not different from that on another mask, so that a mask exposure system used for exposure of the mask for forming the mask circuit patterns thereon may have only a performance capable of forming the mask circuit patterns in small regions by using the first alignment marks. In other words, an expensive mask exposure system using light having a low throughput is not required to be used as the mask exposure system for exposure of the mask for forming the mask circuit patterns thereon.

Since all of the alignment marks are formed on the mask by exposure at a time, the mask circuit patterns can be formed on the mask by exposure using the alignment marks for exposure of a mask and the circuit patterns can be formed on a substrate by exposure using the alignment marks for exposure of a substrate.

Even by using an exposure system not allowed to form all of the alignment marks on the mask by exposure at a time, for example, a reduction transfer exposure system using light, the mask circuit patterns can be highly accurately formed by using the alignment marks for exposure of a mask.

According to the inventions described above, a deviation and a distortion of an electron-optical system and a stage mechanism system of a charged particle beam reduction-and-division transfer exposure system can be corrected by dividedly transferring a positional deviation measurement pattern on a test mask onto a substrate at a specific reduction ratio by means of exposure of the substrate by the charged particle beam reduction-and-division transfer exposure system using the test mask, and detecting the deviation and the distortion of the electron-optical system and the stage mechanism system of the exposure system on the basis of the transferred positional deviation pattern. Accordingly, it is possible to perform exposure of the mask for forming the mask circuit patterns thereon while correcting the deviation and distortion.

According to the inventions described above, since the same master mask is used for forming alignment marks on each of a plurality of masks used in a plurality of exposure steps in the method of fabricating a semiconductor device, it is possible to improve the overlapped accuracy between layers upon exposure of a semiconductor substrate.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

Hereinafter, embodiments of the present invention will be described with reference to the drawings.

Figure 1:
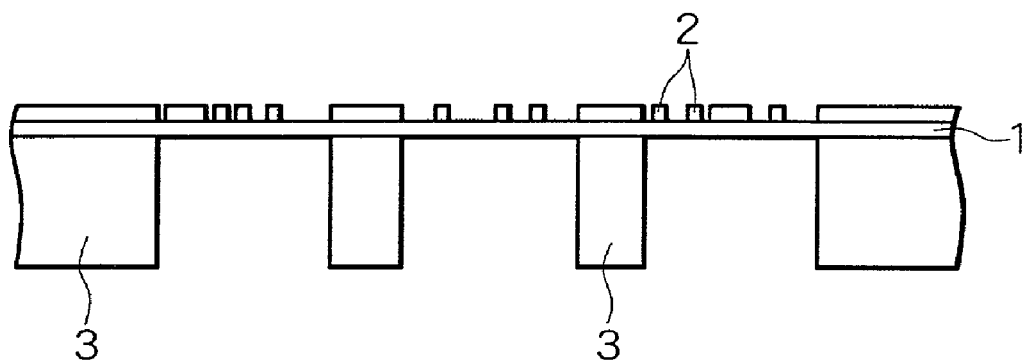
FIG. 1 is a sectional view showing a transmission mask used for an electron beam reduction-and-division transfer exposure system.

In the following embodiments, an electron beam reduction-and-division transfer exposure system is used for exposing a substrate such as a wafer to electron beams. In this system, a transmission mask shown in FIG. 1 has been typically used as a mask for transferring a circuit pattern on a substrate (for example, Japanese Patent Laid-open No. Hei 2-170410). As shown in FIG. 1, a portion, allowing electron beams to pass therethrough, of the transmission mask is called a membrane 1. The membrane 1 is formed of a material being thin enough not to scatter electron beams as much as possible. To be specific, the membrane 1 is typically formed of a layer of silicon nitride (SiN) having a thickness of 100 to 150 nm or a DLC (Diamond-like Carbon) having a thickness of 30 to 100 nm. An electron scatterer 2 having a shape of a circuit pattern to be transferred is formed on one surface of the membrane 1. The electron scatterer 2 is typically formed of a layer of a heavy metal such as tantalum or tungsten having a thickness of 20 to 30 nm or a layer of silicon having a thickness of 2 to 3 μm. On the other hand, a stencil mask shown in FIG. 2 has been also practically used as the mask for transferring a circuit pattern on a substrate. The stencil mask is formed of a mask board 11 having through-holes 12 allowing electron beams to pass therethrough. The through-holes 12 are formed into a shape of a circuit pattern to be transferred. The mask board 11 is typically made from silicon. Even for the stencil mask, like the transmission mask, the thickness of the mask board 11 is set to be as thin as possible (for example, about 2 μm) in order that a portion, having no through-holes, that is, not allowing electron beams to pass therethrough, does not absorb energies of electron beams. This is because, if absorbing energies of electron beams, the mask board 11 generates heat, to be thereby distorted.

Figure 2:
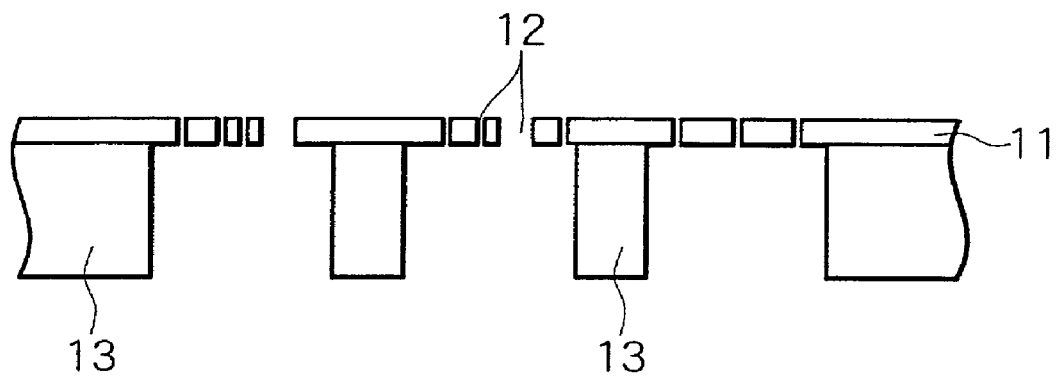
FIG. 2 is a sectional view showing a stencil mask used for the electron beam reduction-and-division transfer exposure system.

In the electron beam reduction-and-division transfer exposure system, however, such a thin transmission mask or stencil mask can be reinforced as follows. Namely, in this exposure system, a region to be transferred at a time is generally set to about 1 mm square on a mask and is, in the case of pattern transfer at a reduction ratio of 1/4, set to about 250 μm square on a substrate such as a wafer. Accordingly, as shown in FIG. 1, supports 3 can be mounted to the transmission mask in such a manner as to be spaced from each other at intervals of about 1 mm, to thereby reinforce the transmission mask, and similarly, as shown in FIG. 2, supports 13 can be mounted to the stencil mask in such a manner as to be spaced from each other at intervals of about 1 mm, to thereby reinforce the stencil mask. Mask circuit patterns are formed in small regions surrounded by the supports 3 or 13. These supports 3 or 13 are typically made from silicon.

Figure 3:
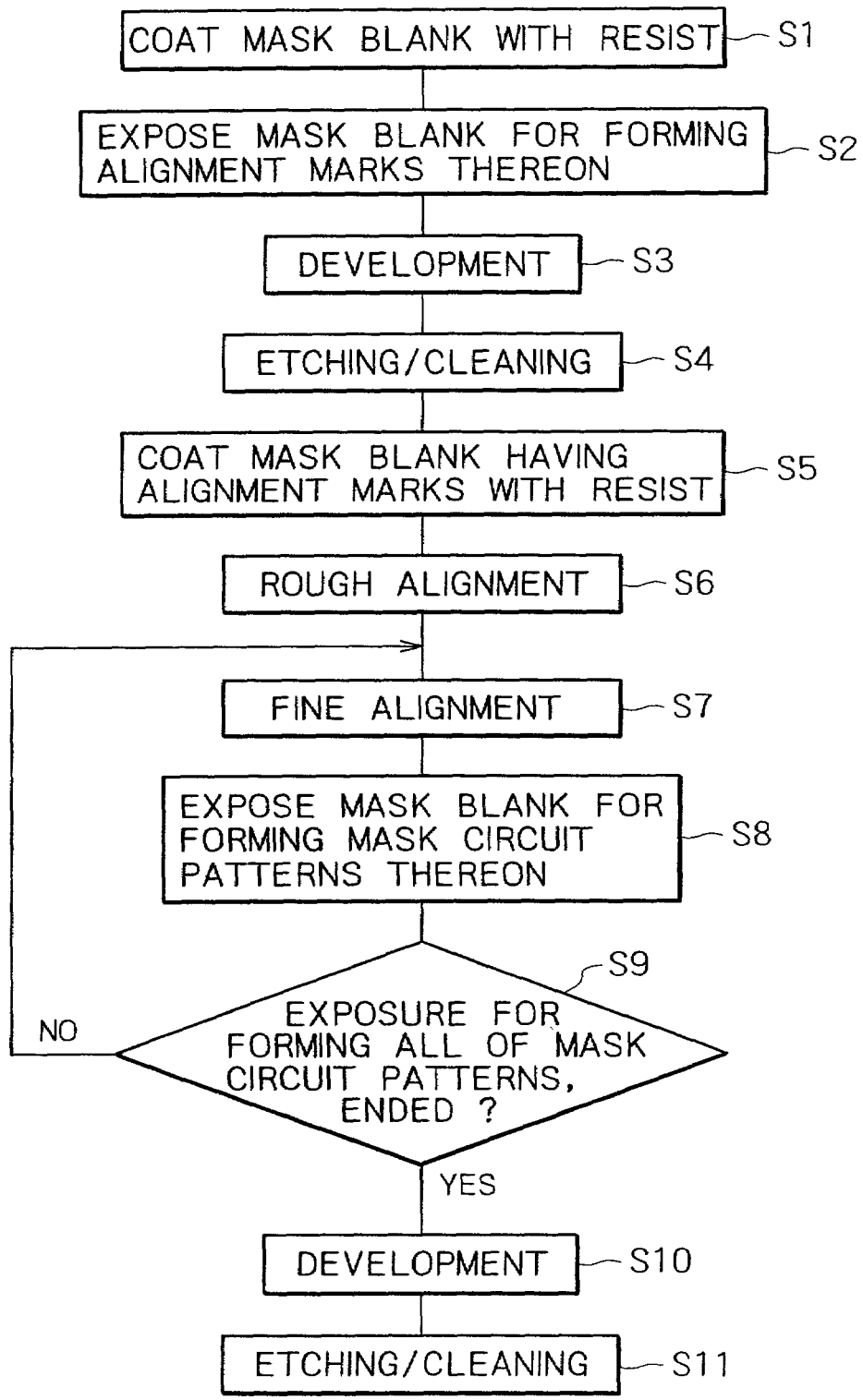
FIG. 3 is a flow chart illustrating a method of making a mask according to a first embodiment of the present invention.

FIG. 3 is a flow chart showing a method of making a mask according to a first embodiment of the present invention.

Figure 4A:
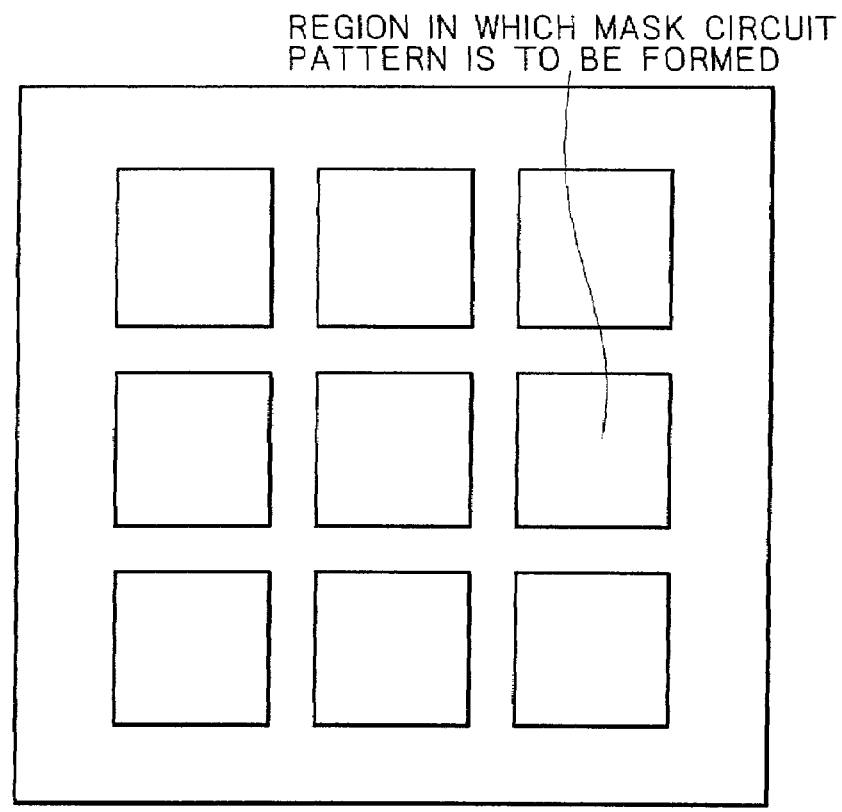
FIG. 4A is a plan view of a mask blank used for the method of making a mask according to the first embodiment.
Figure 4B:
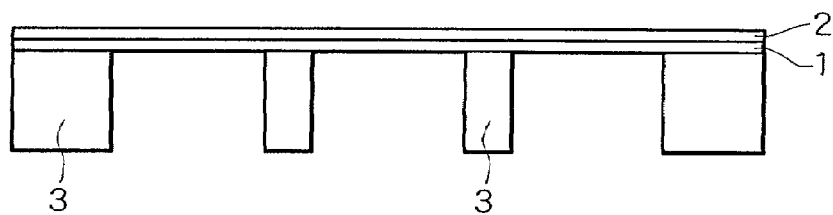
FIG. 4B is a sectional view of the mask blank configured as a transmission mask blank.
Figure 4C:
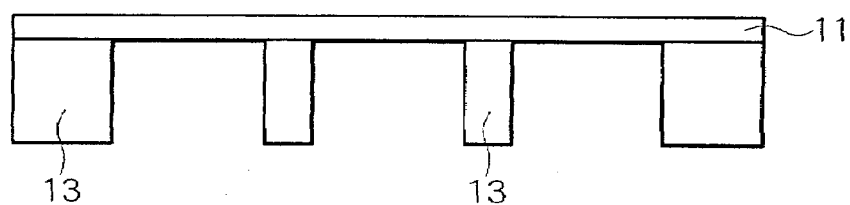
FIG. 4C is a sectional view of the mask blank configured as a stencil mask blank.

As shown in FIG. 3, according to the first embodiment, a mask blank is coated with a resist in step S1. FIGS. 4A to 4C show a mask blank for a mask which is used in an electron beam reduction-and-division transfer exposure system, wherein FIG. 4A is a top view of the mask blank from which the membrane 1 provided with the electron scatterer 2 or the mask board 11 is omitted, FIG. 4B is a sectional view of the mask blank configured as a transmission mask, and FIG. 4C is a sectional view of the mask blank configured as a stencil mask. In the mask blank shown in FIGS. 4A to 4C, as described above, mask circuit patterns are to be formed on the small regions separated from each other by means of the supports 3 or 13. Each of the small regions is formed into a square shape typically having one side of about 1 mm, and each of the supports 3 or 13, which constitute a supporting region among the small regions, typically has a width of about 100 μm. The supports 3 or 13 are formed by selectively etching a silicon wafer typically having a diameter of 8 inches.

Figure 5A:
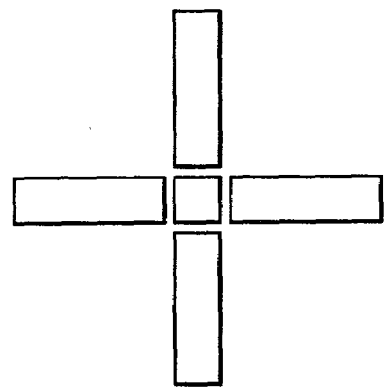
FIGS. 5A to 5C are schematic diagrams showing examples of marks for a mask, which are formed in a supporting region of a mask in the method of making a mask according to the first embodiment.
Figure 5B:
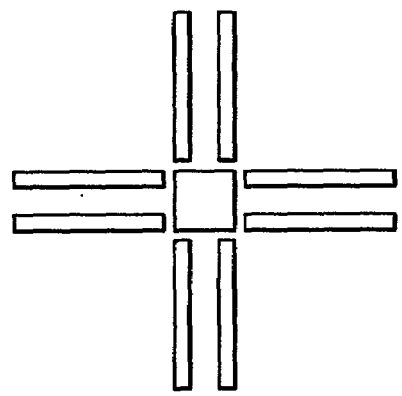
Figure 5C:
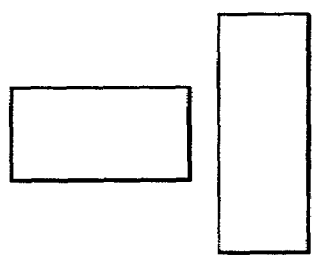

In step S2, the resist coated on the mask blank in step S1 is subjected to exposure for printing, on the resist, two kinds of alignment marks: alignment marks used at the time of exposure of the mask blank for printing mask circuit patterns thereon (hereinafter, referred to as "marks for a mask") and alignment marks used at the time of exposure of a wafer for printing circuit patterns thereon (hereinafter, referred to as "marks for a wafer"). It is to be noted that the marks for a mask are optimized to a mask exposure system used, and the marks for a wafer are optimized to the transfer exposure system used. FIGS. 5A to 5C show examples of the marks for a mask, which are used in the case of adopting, as the mask exposure system, a variable shaped beam type electron beam direct writing exposure system operated at an acceleration voltage of 50 kV. Each of the marks for a mask has a size which is generally in place within a square having one side ranging from 5 μm to a value equivalent to the width of the support 3 or 13, typically, within a square having one side ranging from 20 μm to 50 μm, for example, 30 μm. For the transmission mask, the marks for a mask are confirmed by detecting the presence or absence of the electron scatterer 2 and the thickness thereof. For the stencil mask, the marks for a mask are confirmed by detecting stepped portions of the marks engraved in the mask board 11. In the latter case, to enhance the mark detecting accuracy, the stepped potions of the marks are preferably buried with a heavy metal such as platinum, gold, silver, copper, tungsten, tantalum, or molybdenum. In the case of etching even a stopper (not shown) formed between the mask board 11 and a mask supporting member, however, since the thickness of the mask board 11 of the stencil mask is generally set to about 2 μm, the stepped portions of the marks are deep enough for detection of the marks.

Figure 6:
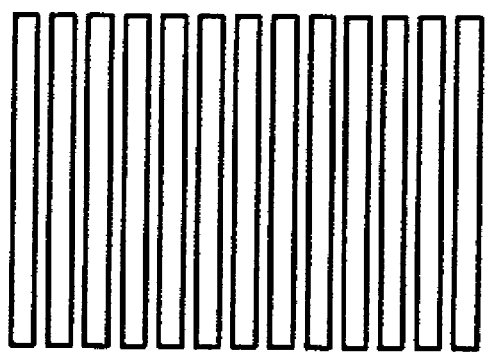
FIG. 6 is a schematic diagram showing one example of a mark for a wafer, which is formed in the supporting region of a mask in the method of making a mask according to the first embodiment.
Figure 6:
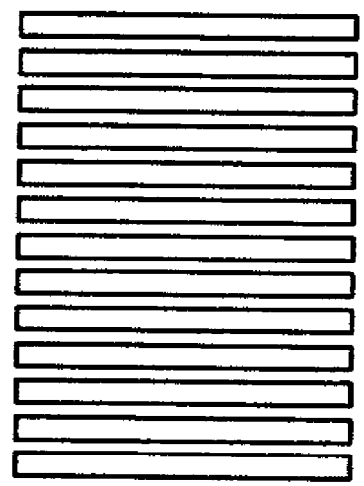

As the marks for a wafer, a pair of line-and-space patterns, each of which is composed of a combination of lines and spaces shown in FIG. 6, can be used. In the pair of line-and-space patterns, the extending direction of the lines and spaces in one of the patterns is perpendicular to the extending direction of the lines and spaces in the other pattern. It is to be noted that since a region to be transferred at a time by electron beams emitted from the electron beam reduction-and-division transfer exposure system is generally set to about 1 mm square on a mask, in the case of detecting the marks for a wafer by electron beams, if the marks for a wafer are formed on the portions of the supports 3 or 13, then such marks cannot be detected by the electron beams. This is because, if the mask is irradiated with a large amount of electron beams for detecting the marks for a wafer, then the mask may be distorted by heat generated by irradiation of the electron beams. For this reason, the marks for a wafer may be formed outside an area formed by all of the small regions on which the mask circuit patterns are to be formed. Alternatively, mark detection may be performed by using a light source not giving heat to the mask, such as a semiconductor laser beam with a low output.

The exposure of the mask blank for forming the marks thereon in step S2 is preferably performed such that all of the marks are formed on the mask blank at a time. The transfer of all of the marks at a time is advantageous in that exposure of the mask for printing the mask circuit patterns thereon can be highly accurately performed on the basis of the marks for a mask located in the supports 3 or 13, and exposure of the wafer for printing circuit patterns therein can be highly accurately performed on the basis of the marks for a wafer located outside the area formed by the small regions in which the mask circuit patterns have been formed, and that such highly accurate exposure can be performed even by using different kinds of marks.

In the case of exposure of the mask blank for forming the marks thereon by using a sufficiently highly accurate exposure system, however, all of the marks are not required to be transferred at a time. For example, in the case of using a reduction transfer exposure system with a reduction ratio of 1/4 or 1/5, which has been mainly used, such as a stepper or scanner type exposure system, all of the marks may be dividedly transferred by performing exposure using only a lens central portion so as not to cause lens distortion of the exposure system.

In fabrication of a semiconductor device, exposure is generally repeated by several times for forming a plurality of layers, and in this case, a mask is required for each of the repeated exposure steps. In the case of exposure of each of mask blanks for masks (required to form a plurality of layers of one type semiconductor device) for forming marks thereon, it may be desirable to expose each of the mask blanks by using the same master mask. To be more specific, marks on the same master mask may be transferred to each of the mask blanks used for forming the plurality of layers of the semiconductor device. The reason for this is as follows: namely, exposure of a substrate such as a wafer, which is repeated by several times, using a plurality of masks must be performed such that a pattern is just over-lapped to the pattern previously formed, and in this case, if mask circuit patterns formed on one mask are distorted in a manner different from distortion of mask circuit patterns on another mask, then an overlapping accuracy of two of a plurality of layers is degraded, thereby reducing the fabrication yield of the semiconductor device. On the contrary, in the case of transferring the marks on the same master mask onto each of the plurality of masks, if the mask circuit patterns on one mask are distorted from ideal positions, the mask circuit patterns on another mask are distorted in the same manner, with a result that the degradation of the overlapping accuracy becomes small.

Figure 7A:
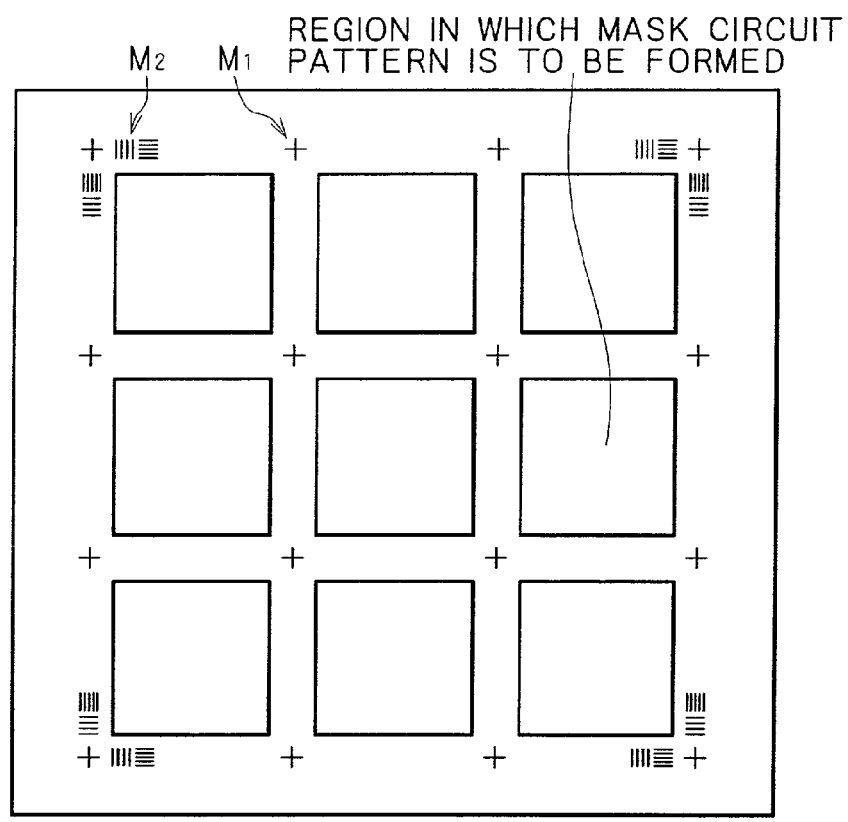
FIG. 7A is a plan view of the mask blank after the marks for a mask and the marks for a wafer are formed thereon in the method of making a mask according to the first embodiment.
Figure 7B:
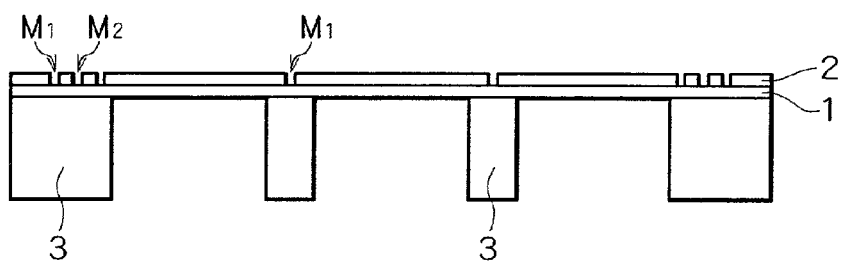
FIG. 7B is a sectional view of the mask blank configured as the transmission mask blank.
Figure 7C:
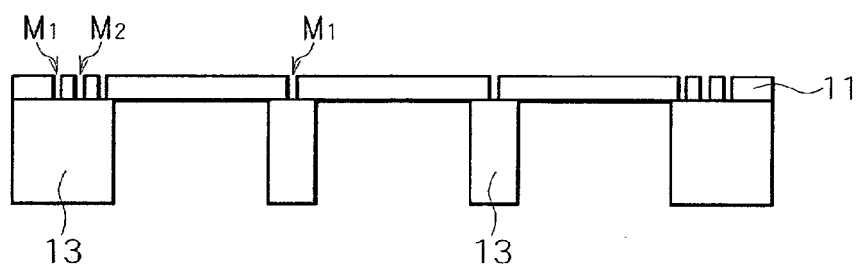
FIG. 7C is a sectional view of the mask blank configured as the stencil mask blank.

In step S3, the mask board thus exposed is developed and in step S4, the mask board is etched and cleaned, to obtain the mask blank with the alignment marks as shown in FIGS. 7A to 7C. In FIGS. 7A to 7C, character $M_1$ designates the mark for a mask and $M_2$ designates the mark for a wafer. It is to be noted that, in FIGS. 7A to 7C, the marks $M_1$ for a mask are located at positions near four corners of each small region in which the mask circuit patterns are to be formed; however, the marks $M_1$ for a mask are typically formed into square shapes, each having one side of 30 μm, which are arranged in two rows in each portion, between two of the small regions, of the supporting region.

The mask blank with the alignment marks thus obtained in the above steps is then subjected to exposure for printing mask circuit patterns thereon. In step S5, the mask blank with the alignment marks is coated with a resist. In step S6 (rough alignment step), the entire mask blank is roughly aligned by using the marks $M_1$ for a mask located outside the area formed by the small regions on which mask circuit patterns are to be formed. In step S7 (fine alignment step), the mask blank is finely aligned by using the marks $M_1$ for a mask located in the area formed by the small regions in such a manner as to be positioned around the small regions, that is, in the supports 3 or 13. In step S8, the mask blank is subjected to exposure to print mask circuit patterns thereon on the basis of the alignment information obtained in steps S6 and S7. The operations in steps S7 and S8 are repeated until all of the mask circuit patterns are printed on the mask blank. In step S10, the mask black is developed, and in step S11, the mask blank is etched and cleaned, to obtain a mask. It is to be noted that, in place of the operations in steps S7 and S8, a global alignment process may be carried out, in which fine alignment in step S7 is previously performed for all of the small regions and the exposure of the mask blank in step S8 is performed.

Since the two kinds of alignment marks $M_1$ and $M_2$ formed in steps S1 to S4 are used not only at the time of exposure of the mask but only at the time of exposure of a substrate such as a wafer, it is required to protect the alignment marks at the time of formation of the mask circuit patterns. To be more specific, at the time of formation of the mask circuit patterns by etching in step S11, the marks $M_1$ for a mask and the marks $M_2$ for a wafer may be previously coated with a resist, thereby protecting these marks. If a positive type resist is used for covering the marks, the mark portions are not allowed to be exposed, and if a negative type resist is used for covering the marks, the mark portions may be exposed. In this case, since the marks $M_1$ for a mask are exposed at the time of scanning of electron beams for exposure of the mask blank for printing the mask circuit patterns thereon, the positive type resist becomes useless for protecting the marks $M_1$ for a mask. From this viewpoint, as the positive type resist, a resist reversed from positive to negative by irradiation of a large amount of electron beams may be used. In the case of using such a reversed type resist, the marks can be protected by irradiating the resist with a large amount of electron beams. Additionally, even by using a resist of a type not reversed from positive to negative, there occurs no problem because the marks used at the time of exposure of the mask are not required to be used at the time of exposure of a wafer.

As described above, according to the first embodiment, since all of the marks for a mask are transferred to a mask blank at a time by using an exposure system for marks for a mask, it is possible to significantly increase positional accuracies of the entire mask circuit patterns. Since a relative distance between two of the marks on one mask is not different from that on another mask, an exposure system capable of only accurately exposing the mask blank for printing the mask circuit patterns on the small regions on the basis of the marks for a mask can be used as the mask exposure system for exposure of the mask blank for printing the mask circuit patterns thereon. Accordingly, as the mask exposure system, not an expensive mask exposure system using light with a low throughput but an electron beam direct writing exposure system for exposure of a wafer (for example, exposure system having been introduced in J. Vac. Sci. Technol. B10(6), p. 2759 (1992)) can be used. Such an electron beam direct writing exposure system is characterized in that a beam size is 10 µm or less, and a maximum deflection width of an electron beam in a state that a stage is not moved is set to be larger than a total of a width of each of a plurality of small regions and a width of a portion, between two of the small regions, of a supporting regions on a mask blank; however, the electron beam direct writing exposure system can expose a necessary portion of the mask blank only by deflection thereof because the total of the small region and the portion, between two of the small regions, of the supporting region is generally set to about 1.5 mm at present. Since the above exposure system can expose a necessary portion on the mask blank only by deflection, that is, with no movement of the stage, it is possible to relatively easily ensure the positional accuracies of the mask circuit patterns.

Since most of the electron beam direct writing exposure systems are configured such that an electron beam size is as small as 5 µm square at maximum on a wafer, even if the electron beam is scanned to detect the marks in the supports 3 or 13, the mask is not distorted by heat caused by irradiation of the electron beam. If the mask is excessively heated by the electron beam having a size of 5 µm square on a wafer, the size of the electron beam may be further reduced, or an amount of the electron beam irradiated at a time may be reduced and the scanning of the electron beam be repeated.

A second embodiment of the present invention will be described below. In the first embodiment, all of the alignment marks are printed on the mask blank at a time by one exposure. On the contrary, in the second embodiment, the marks are printed on the mask blank at a high accuracy by using an exposure system not allowed to print all of the marks at a time by one exposure. The flow chart illustrating the method according to the second embodiment is shown in FIG. 8.

Figure 8:
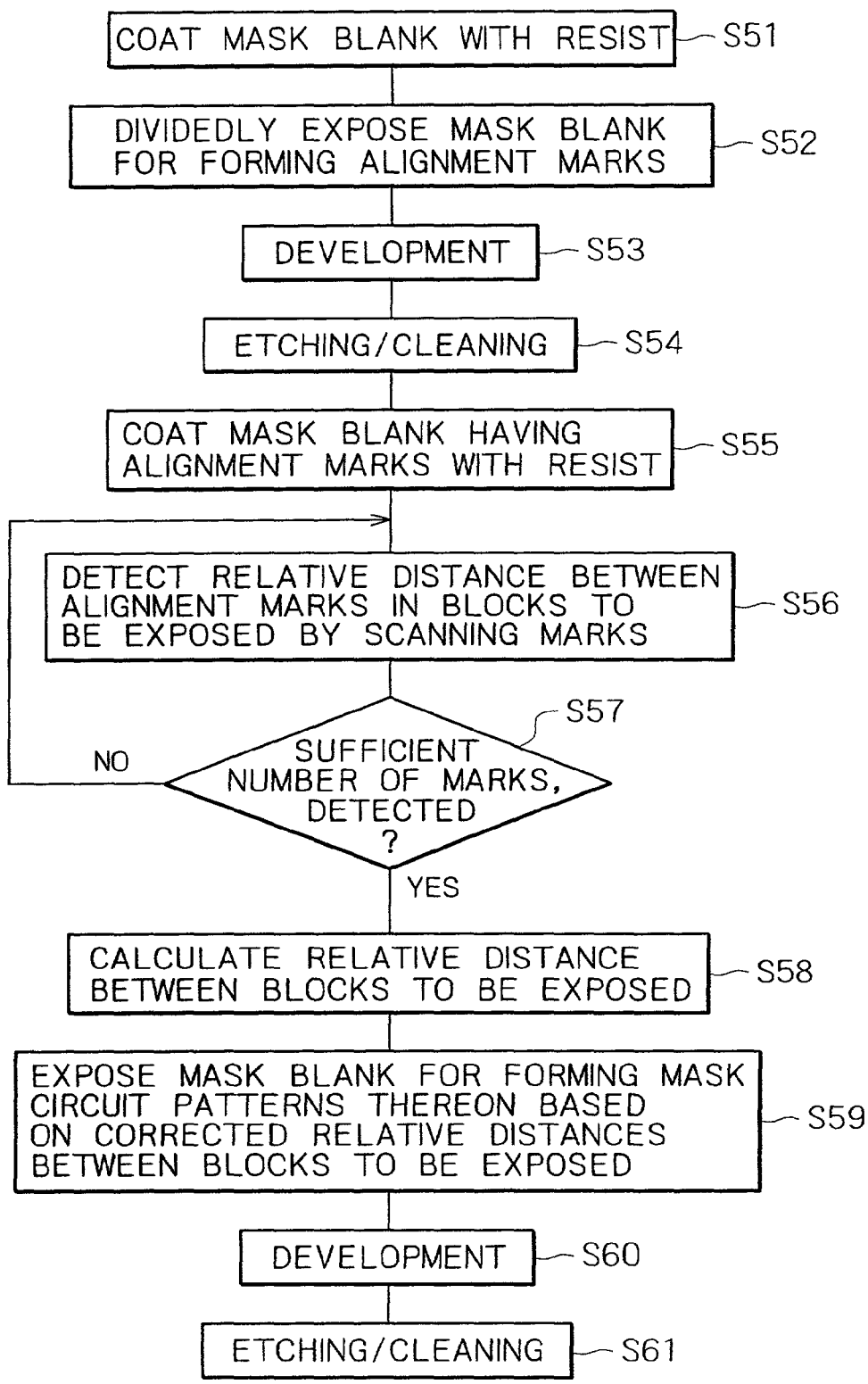
FIG. 8 is a flow chart illustrating a method of making a mask according to a second embodiment of the present invention.

As shown in FIG. 8, a mask blank is coated with a resist in step S51. In step S52, the resist coated on the mask blank is repeatedly exposed by a stepper or the like for dividedly printing marks thereon. In step S53, the mask blank is developed, and in step S54, the mask blank is etched and cleaned.

In step S55, the mask blank with the alignment marks thus obtained is coated with a resist.

Before alignment based on the marks, a positional relationship between the marks is detected by using the marks of the number being as large as possible. To be more specific, each relative distance between one of a plurality of the marks located in one block to be exposed and one of a plurality of the marks located in another block to be exposed. In general, a measurement error becomes small in proportional to a root of the number of samples. Concretely, if 100 pairs of the masks located in two blocks are used, the positional accuracy between the two blocks becomes as large as about 10 times, as compared with the use of one pair of the marks located in the two blocks. That is to say, since a relative distance between two of the marks in one block to be exposed is essentially correct, each relative distance between two of the blocks to be exposed can be highly accurately measured by using a plurality of the marks located in each of the blocks to be exposed. As described above, an exposure system including a stage not highly accurate so much or an electron beam direct writing exposure system can be used for exposure of the mask in the first embodiment, and even in the second embodiment, such an exposure system can be used because the degree of an error is reduced by detecting each relative distance between two of the blocks to be exposed by using a plurality of marks located in each of the blocks to be exposed. That is to say, according to the second embodiment, although marks are dividedly printed on a mask by repeated exposure, since each relative distance between two of blocks to be exposed can be accurately measured, exposure of the mask for printing mask circuit patterns thereon can be performed on the basis of the fed-back measured results, with a result that the mask circuit patterns can be printed on the mask by exposure at an accuracy comparable to the accuracy obtained in the case of printing the marks on the mask at a time by one exposure in the first embodiment.

Figure 9:
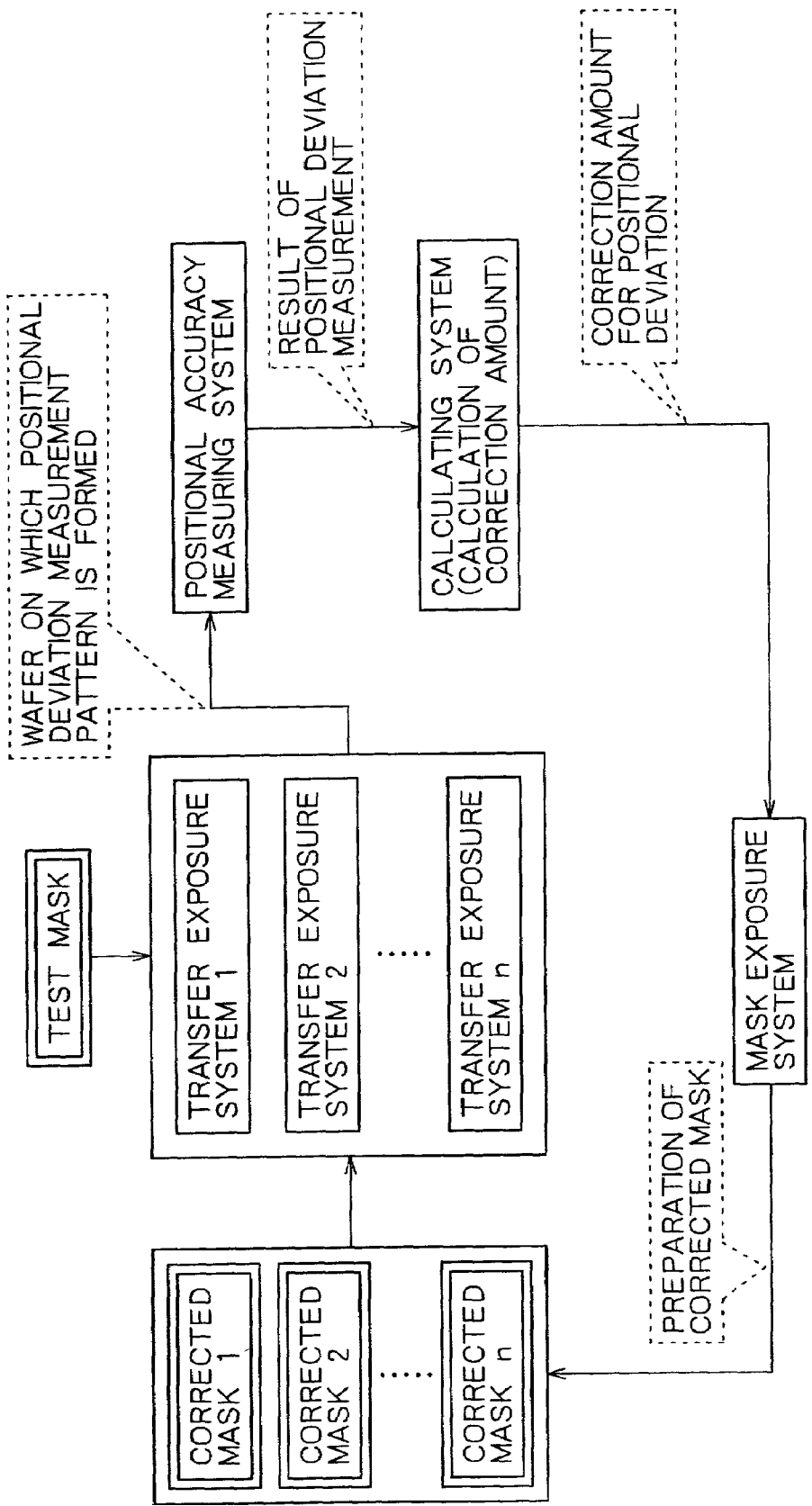
FIG. 9 is a schematic diagram illustrating a concept of correction for a positional deviation by using a test mask in a method of making a mask according to a third embodiment of the present invention.
Figure 10:
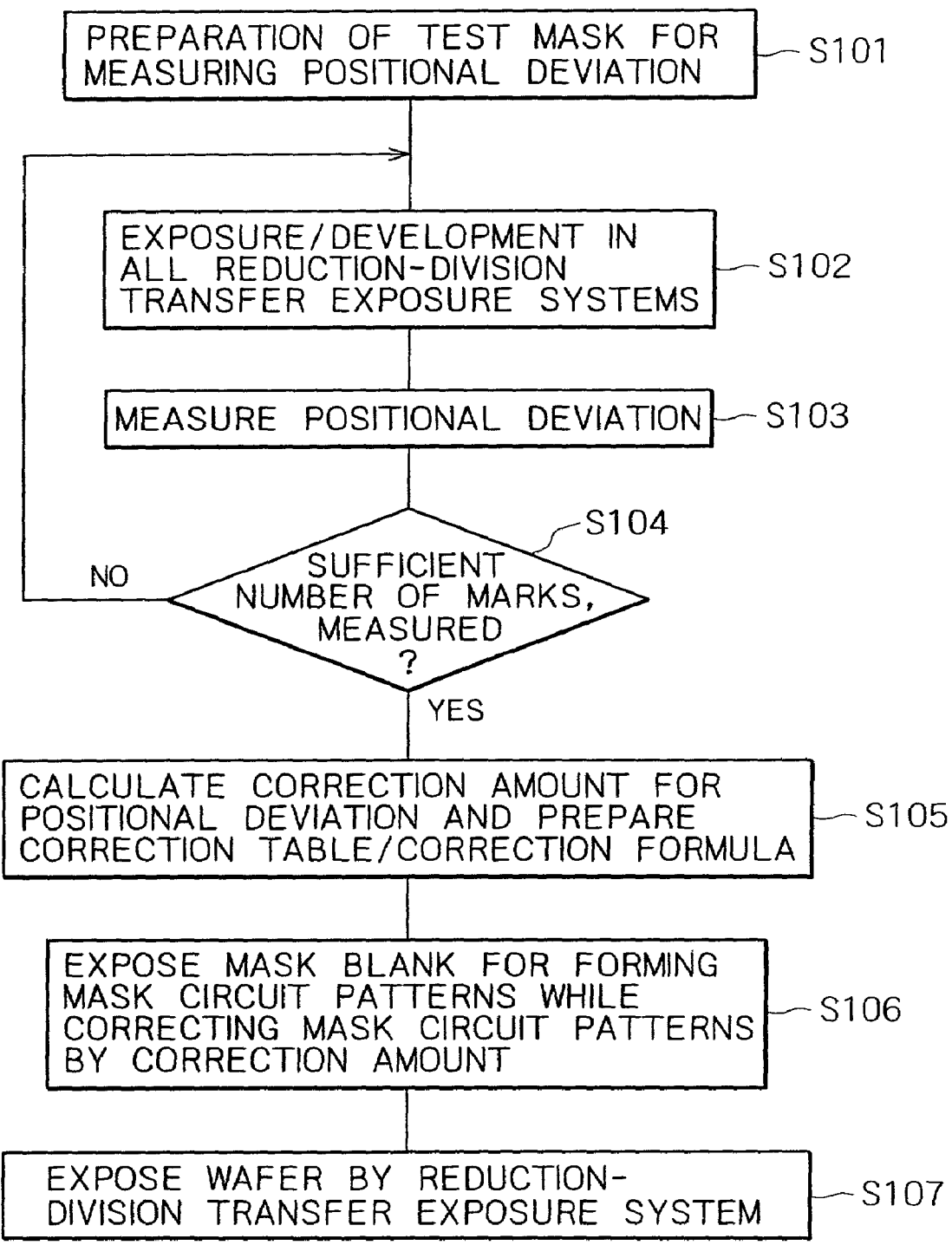
FIG. 10 is a flow chart illustrating a method of correcting a positional deviation by using the test mask in the method of making a mask according to the third embodiment.

A third embodiment of the present invention will be described below. FIG. 9 shows a concept of correction for a positional deviation of an electron beam reduction-and-division transfer exposure system by using a test mask, and FIG. 10 shows a flow chart illustrating the correction for a positional deviation by using the test mask.

Figure 11:
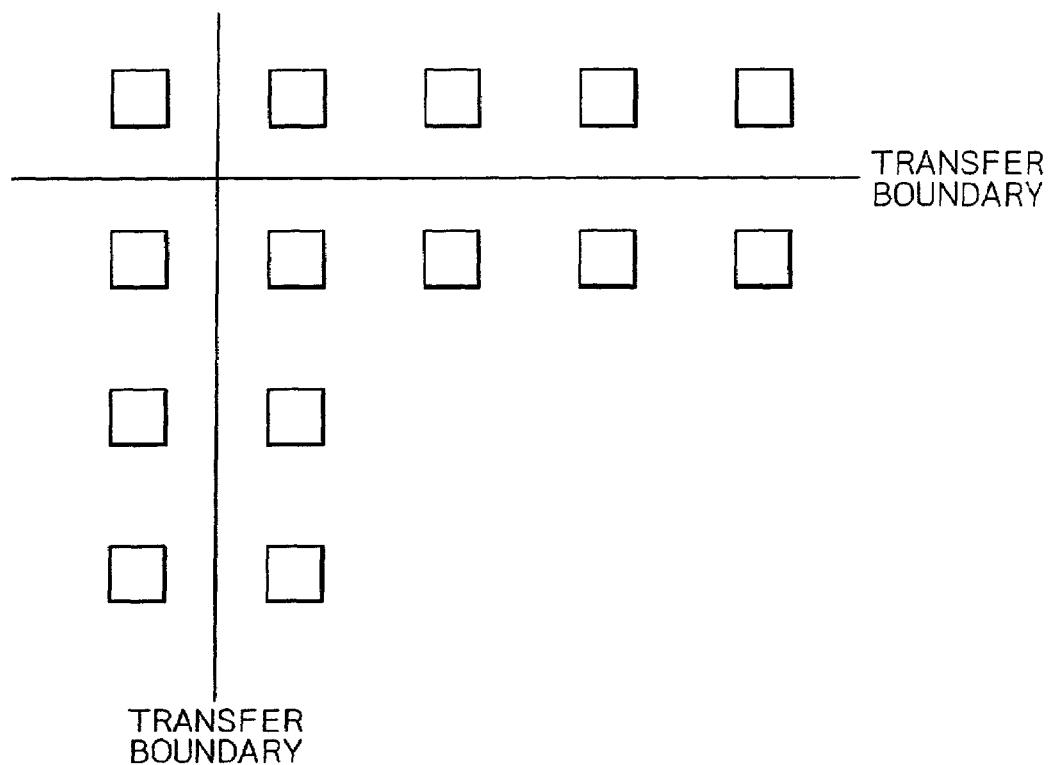
FIG. 11 is a schematic diagram showing one example of a pattern formed on the test mask used in the method of making a mask according to the third embodiment.
Figure 12:
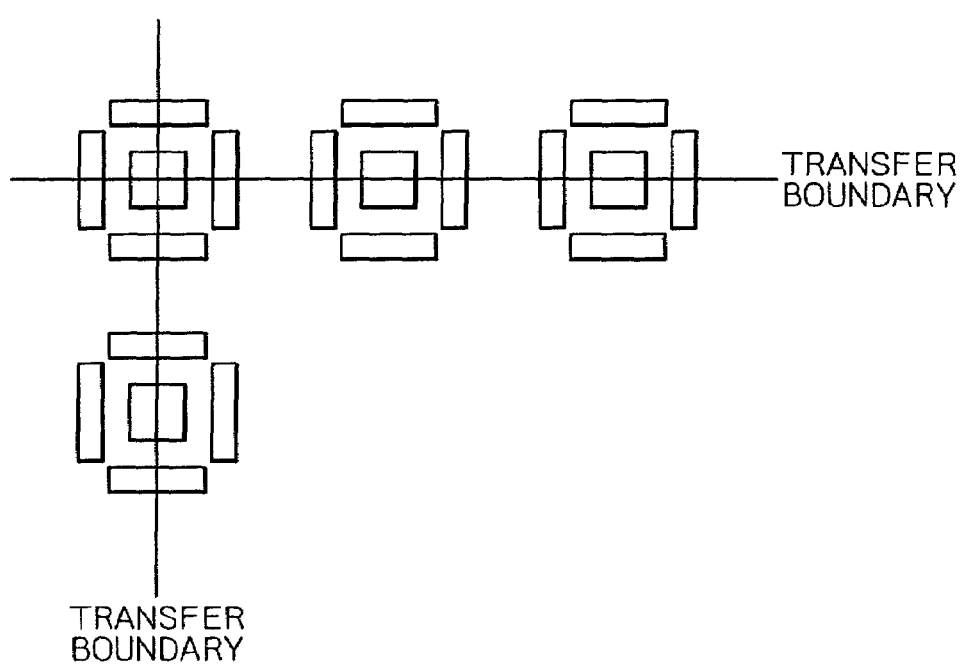
FIG. 12 is a schematic diagram showing one example of a pattern formed on the test mask used in the method of making a mask according to the third embodiment.
Figure 13:
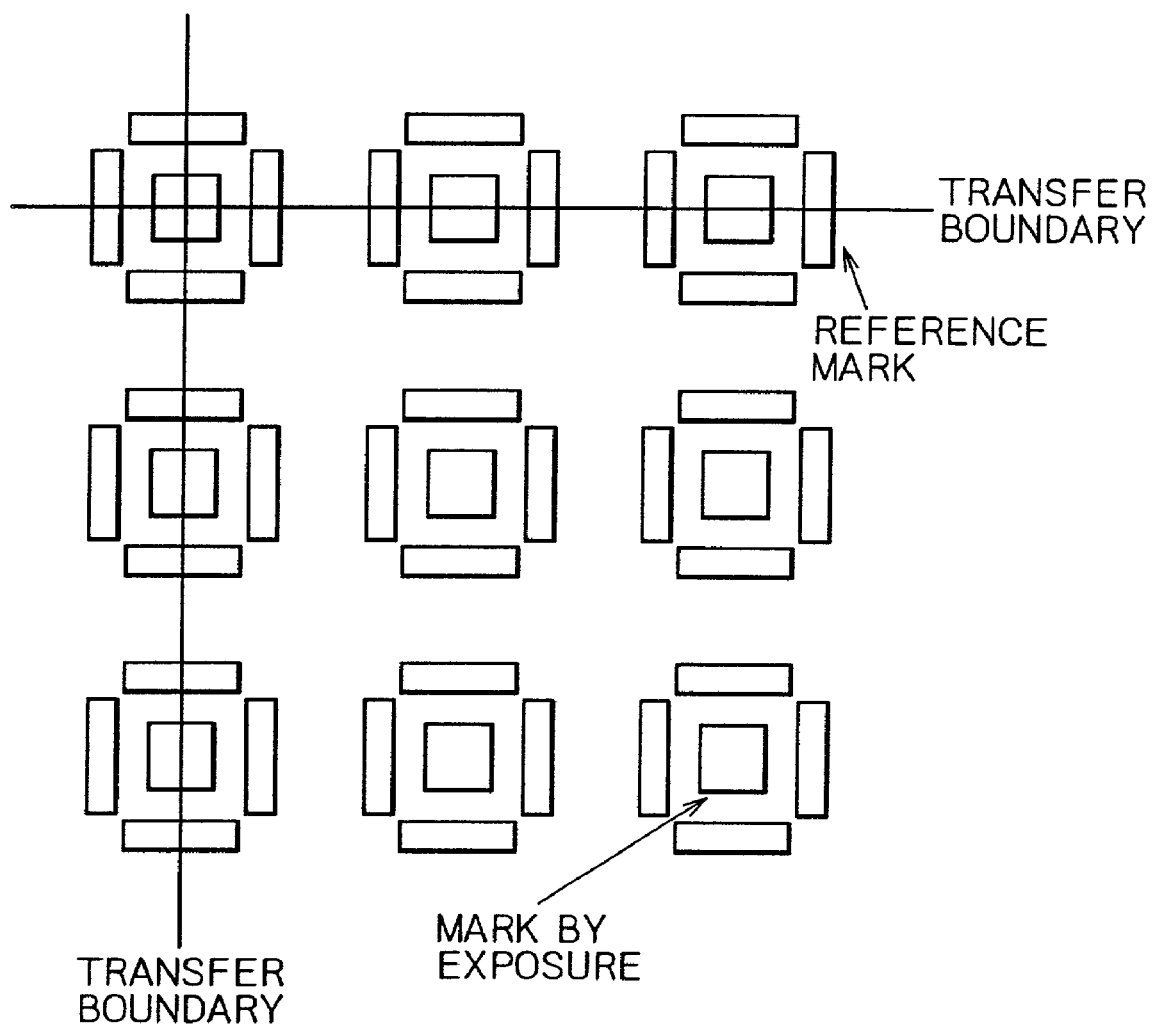
FIG. 13 is a schematic diagram showing one example of a pattern formed on the test mask used in the method of making a mask according to the third embodiment.

According to the third embodiment, a test mask is first prepared in step S101. FIGS. 11, 12 and 13 show examples of test patterns transferred on a substrate such as a wafer. In the case of evaluating only stitching accuracies of circuit patterns dividedly transferred, the test patterns shown in FIGS. 11 and 12 may be used.

FIG. 11 shows a test pattern used in the case where two character pattern portions to be dividedly transferred by exposure are not overlapped to each other at a boundary between the two pattern portions. In this case, a deviation of a relative positional relationship between the two character pattern portions, opposed to each other with the boundary therebetween, from a designed value is measured. The measurement of such a deviation can be performed by detecting positions of centers of gravity of the two character pattern portions by a length measurement SEM (Scanning Electron Microscope).

FIG. 12 shows a test pattern used in the case where two character pattern portions to be dividedly transferred by exposure are partially overlapped to each other at a boundary therebetween. In this case, at the first exposure, one character pattern composed of four outer rectangular characters is printed, and at the second exposure, the other character pattern portion composed of one inner square character is printed. A positional deviation between the two character pattern portions, that is, the outer rectangular characters and the inner square character from a designed value is measured. The measurement of such a positional deviation can be performed by detecting edges of the two character pattern portions by using an optical alignment accuracy measurement system.

To evaluate not stitching accuracies of circuit patterns dividedly transferred but absolute positional accuracies of circuit patterns, there may be used a test pattern as shown in FIG. 13. In this case, reference scales of highly accurate alignment marks are required to be previously formed on a substrate such as a wafer by separate means. A positional deviation between one of the character pattern portions and the corresponding reference scale can be measured by detecting an edge of the character pattern portion and the reference scale by using an optical alignment accuracy measuring system.

In step S102, the positional deviation measurement pattern is transferred on a substrate such as a wafer by exposure by using the test mask prepared in step S101. In step S103, a positional deviation on the substrate is measured by the above-described method. If the positional deviation cannot be measured at a sufficient accuracy only by one exposure and one measurement, then the exposure and measurement may be repeated. Such a statistical processing enables more stable correction. In this case, from the viewpoint of correction of a difference between all of exposure systems used for exposure of a substrate or wafer, it may be desirable to use the same test mask for all of the exposure systems.

In step S105, the results of positional deviation measurements obtained in the above steps is statistically processed, so that a positional deviation amount due to an electron-optical system of each exposure system for a substrate such as a wafer, and a correction amount for the positional deviation are obtained by the measured results thus statistically processed. The correction of a positional deviation may be given by a correction formula or a correction table in the form of a matrix.

In step S106, at the time of making a mask described in the first embodiment, exposure of the mask for printing mask circuit patterns thereon is performed such that the mask circuit patterns are deformed by the correction amount obtained in step S105 so as to correct the positional deviation of the exposure system for a substrate such as a wafer. In this way, a substrate such a wafer is subjected to exposure for transferring circuit patterns thereon by using the mask on which the corrected mask circuit patterns are formed, with a result that the circuit patterns can be transferred with less positional deviation, that is, at a high accuracy. In this case, by making a mask corrected with a correction amount suitably adjusted for each exposure system for a substrate such as a wafer, a difference between the exposure systems for a substrate such as wafer can be canceled by the mask.

While the embodiments of the present invention have been described using specific terms, the present invention is not limited thereto, and it is to be understood that various modifications may be made without departing from the technical thought of the present invention.

For example, the numerical values, shapes, materials, and steps described in the above-described embodiments are illustrative only, and therefore, they may be changed as needed.

For example, in the first embodiment, the present invention is applied to the mask in which each of the small regions on which the mask circuit patterns are to be formed is surrounded by the supporting region in the X direction and the Y direction; however, the present invention can be applied to a mask used for an electron beam reduction-and-division transfer exposure system having been introduced, for example, in J. Vac. Sci. Technol. B9 (6), p. 3000 (1991)).

The mask described in this document has a structure that small regions are longer in one direction; however, by disposing marks for a mask at supporting portions of a mask blank like the first embodiment and exposing the mask blank without movement of a stage, the mask blank can be highly accurately exposed.

In the mask blank shown in FIGS. 4A to 4C, the supports 3 or 13 are formed after etching of the back surface is ended; however, the present invention is not limited thereto but may be configured such that the alignment marks and mask circuit patterns are first formed and then the back surface of the mask blank is etched. It may be determined depending on the accuracy and cost necessary for the mask which is effective, of the above configurations.

While a preferred embodiment of the present invention has been described using specific terms, such description is for illustrative purposes only, and it is to be understood that changes and variations may be made without departing from the spirit or scope of the following claims.

What is claimed is:

1. A method of producing a mask-making member, said member has a plurality of pattern formation regions in which mask circuit patterns are to be formed, and a supporting region in which any mask circuit pattern is not to be formed, said supporting region being provided for holding said plurality of pattern formation regions while separating said plurality of pattern formation regions from each other, said supporting region having first alignment marks used at the time of alignment with a mask made from said mask-making member for forming said mask circuit patterns thereon, second alignment marks being used at a time of alignment with a substrate to be exposed for forming circuit patterns thereon, said method comprising the step of:

forming all of said first alignment marks and said second alignment marks on said mask-making member at one time, said first alignment marks being formed in such a manner that one or more of said first alignment marks are located in a portion of said supporting region around each of said plurality of pattern formation regions and said second alignment marks being formed in such a manner as to be all located in a portion of said supporting region outside an area formed by said plurality of said pattern formation regions, and the alignment with said mask-making member for forming said first alignment marks and said second alignment marks thereon at one time is performed by using a stepper type exposure system with a projected magnification of a 1:1 ratio or a low reduction ratio.

2. A method of producing a mask-making member, said member has a plurality of pattern formation regions in which mask circuit patterns are to be formed, and a supporting region in which any mask circuit pattern is not to be formed, said supporting region being provided for holding said plurality of pattern formation regions while separating said plurality of pattern formation regions from each other, said supporting region having first alignment marks used at the time of alignment with a mask made from said mask-making member for forming said mask circuit patterns thereon, second alignment marks being used at a time of alignment with a substrate to be exposed for forming circuit patterns thereon, said method comprising the step of:

forming all of said first alignment marks and said second alignment marks on said mask-making member at one time, said first alignment marks being formed in such a manner that one or more of said first alignment marks are located in a portion of said supporting region around each of said plurality of pattern formation regions and said second alignment marks being formed in such a manner as to be all located in a portion of said supporting region outside an area formed by said plurality of said pattern formation regions, and the alignment with said mask-making member for forming said first alignment marks and said second alignment marks thereon at one time is performed by using a scanner type exposure system with a projected magnification of a 1:1 ratio or a low reduction ratio.

3. A method of producing a mask-making member, said member has a plurality of pattern formation regions in which mask circuit patterns are to be formed, and a supporting region in which any mask circuit pattern is not to be formed, said supporting region being provided for holding said plurality of pattern formation regions while separating said plurality of pattern formation regions from each other, said supporting region having first alignment marks used at the time of alignment with a mask made from said mask-making member for forming said mask circuit patterns thereon, second alignment marks being used at a time of alignment with a substrate to be exposed for forming circuit patterns thereon, said method comprising the step of:

forming all of said first alignment marks and said second alignment marks on said mask-making member at one time, said first alignment marks being formed in such a manner that one or more of said first alignment marks are located in a portion of said supporting region around each of said plurality of pattern formation regions and said second alignment marks being formed in such a manner as to be all located in a portion of said supporting region outside an area formed by said plurality of said pattern formation regions, and the alignment with said mask-making member for forming said first alignment marks and said second alignment marks thereon at one time is performed by using a contact type full exposure system.

4. A method of producing a mask-making member, said member has a plurality of pattern formation regions in which mask circuit patterns are to be formed, and a supporting region in which any mask circuit pattern is not to be formed, said supporting region being provided for holding said plurality of pattern formation regions while separating said plurality of pattern formation regions from each other, said supporting region having first alignment marks used at the time of alignment with a mask made from said mask-making member for forming said mask circuit patterns thereon, second alignment marks being used at a time of alignment with a substrate to be exposed for forming circuit patterns thereon, said method comprising the step of:

forming all of said first alignment marks and said second alignment marks on said mask-making member at one time, said first alignment marks being formed in such a manner that one or more of said first alignment marks are located in a portion of said supporting region around each of said plurality of pattern formation regions and said second alignment marks being formed in such a manner as to be all located in a portion of said supporting region outside an area formed by said plurality of said pattern formation regions, and the alignment with said mask-making member for forming said first alignment marks and said second alignment marks thereon at one time is performed by using a proximity type full exposure system.

5. A method of producing a mask-making member, said member has a plurality of pattern formation regions in which mask circuit patterns are to be formed, and a supporting region in which any mask circuit pattern is not to be formed, said supporting region being provided for holding said plurality of pattern formation regions while separating said plurality of pattern formation regions from each other, said supporting region having first alignment marks used at the time of alignment with a mask made from said mask-making member for forming said mask circuit patterns thereon, second alignment marks being used at a time of alignment with a substrate to be exposed for forming circuit patterns thereon, said method comprising the step of:

forming all of said first alignment marks and said second alignment marks on said mask-making member at one time, said first alignment marks being formed in such a manner that one or more of said first alignment marks are located in a portion of said supporting region around each of said plurality of pattern formation regions and said second alignment marks being formed in such a manner as to be all located in a portion of said supporting region outside an area formed by said plurality of said pattern formation regions, and the alignment with said mask-making member for forming said first alignment marks and said second alignment marks thereon at one time is performed by using a mirror-projections type full exposure system.

6. A method of producing a mask-making member, which member has a plurality of pattern formation regions in which mask circuit patterns are to be formed, and a supporting region in which any mask circuit pattern is not to be formed, said supporting region being provided for holding said plurality of pattern formation regions while separating said plurality of pattern formation regions from each other, said supporting region having first alignment marks used at the time of alignment with a mask made from said mask-making member for forming said mask circuit patterns thereon, second alignment marks being used at a time of alignment with a substrate to be exposed for forming circuit patterns thereon, said method comprising the steps of:

dividing all of said first alignment marks and said second alignment marks to be formed on said mask-making member into a plurality of groups each containing pluralities of said first alignment marks and said second alignment marks, and sequentially forming said alignment marks and said second alignment marks on said mask-making member by sequential exposure performed for each of said pluralities of groups.

7. A method of producing a mask-making member according to claim 6, wherein said first alignment marks are formed in such a manner that one or more of said first alignment marks are located in a portion of said supporting region around each of said plurality of pattern formation regions, and said second alignment marks are formed in such a manner as to be all located in a portion of said supporting region outside an area formed by said plurality of said pattern formation regions.

8. A method of producing a mask-making member according to claim 6, wherein shapes of said first alignment marks are different from those of said second alignment marks.

9. A method of producing a mask-making member according to claim 6, wherein said mask-making member is a transmission mask-making member.

10. A method of producing a mask-making member according to claim 6, wherein said mask-making member is a stencil mask-making member.

11. A method of producing a mask-making member according to claim 9, wherein said first alignment marks and said second alignment marks are formed on an electron scatterer formed on a membrane.

12. A method of producing a mask-making member according to claim 9, wherein said first alignment marks and said second alignment marks are formed on an electron scatterer formed on a membrane by selectively removing said electron scatterer.

13. A method of producing a mask-making member according to claim 10, wherein said first alignment marks and said second alignment marks are formed on a mask board.

14. A method of producing a mask-making member according to claim 10, wherein said first alignment marks and said second alignment marks are formed on a mask board by selectively removing said mask board.

15. A method of producing a mask-making member according to claim 10, wherein said first alignment marks and said second alignment marks are formed on a mask board by selectively removing said mask board to form holes or grooves in said mask board, and burying said holes or grooves with a metal whose atoms have atomic weights heavier than those of atoms of said mask board.

16. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at a time of alignment with said mask for forming said mask circuit patterns thereon, second alignment marks used at a time of alignment with a substrate to be exposed for forming circuit patterns thereon, said method comprising the step of:
forming all of said first alignment marks and said second alignment marks on said mask at one time;
wherein said plurality of pattern formation regions are exposed to charged particle beams by using said first alignment marks for forming said mask circuit patterns on said plurality of pattern formation regions; and
wherein said alignment with said plurality of pattern formation regions to the charged particle beams is performed by using a charged particle beam exposure system configured such that the charged particle beam has a size of 10 μm or less and a maximum deflection width of the charged particle beam in a state that a stage on which an electron-optical system is mounted is not moved is larger than a total of a width of each of said plurality of pattern formation regions and a width of a portion of said supporting region between two of said plurality of pattern formation regions.

17. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at a time of alignment with said mask for forming said mask circuit patterns thereon, second alignment marks used at time of alignment with a substrate to be exposed for forming circuit patterns thereon, said method comprising the step of:
forming all of said first alignment marks and said second alignment marks on said mask at one time;
wherein said first alignment marks are formed in such a manner that one or more of said first alignment marks are located in a portion of said supporting region around each of said plurality of pattern formation regions, and said second alignment marks are formed in such a manner as to be all located in a portion of said supporting region outside an area formed by said plurality of said pattern formation regions.

18. A method of making a mask according to claim 17, wherein said plurality of pattern formation regions are exposed to charged particle beams by using said first alignment marks for forming said mask circuit patterns on said plurality of pattern formation regions.

19. A method of making a mask according to claim 17, wherein said first alignment marks and said second alignment marks are covered with a protective film before exposure by the charged particle beams.

20. A method of making a mask according to claim 17, wherein shapes of said first alignment marks are different from those of said second alignment marks.

21. A method of making a mask according to claim 17, wherein said mask is a transmission mask.

22. A method of making a mask according to claim 17, wherein said mask is a stencil mask.

23. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at time of alignment with said mask for forming said mask circuit patterns thereon, second alignment marks used at a time of alignment with a substrate to be exposed for forming circuit patterns thereon, said method comprising the step of:
forming all of said first alignment marks and said second alignment marks on said mask at one time;
wherein said first alignment marks and said second alignment marks are formed on a mask board by selectively removing said mask board to form holes or grooves in said mask board and burying said holes or grooves with a metal whose atoms have atomic weights heavier than those of atoms of said mask board.

24. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at a time of alignment with said mask for forming said mask circuit patterns thereon, second alignment marks used at a time of alignment with a substrate to be exposed for forming circuit patterns thereon, said method comprising the step of:
forming all of said first alignment marks and said second alignment marks on said mask at one time;
wherein said mask is a stencil mask; and
wherein said first alignment marks and said second alignment marks are formed on a mask board by selectively removing said mask board to form holes or grooves in said mask board and burying said holes or grooves with a metal whose atoms have atomic weights heavier than those of atoms of said mask board.

25. A method of making a mask according to claim 24, wherein said metal is platinum, gold, silver, copper, tungsten, tantalum, or molybdenum.

26. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at a time of alignment with said mask for forming said mask circuit patterns thereon, second alignment marks used at a time of alignment with a substrate to be exposed for forming circuit patterns thereon, said method comprising the step of:

forming all of said first alignment marks and said second alignment marks on said mask at one time;
wherein the alignment with said mask for forming said first alignment marks and said second alignment marks thereon at one time is performed by using a stepper type exposure system with a projected magnification of a 1:1 ratio or low reduction ratio.

27. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at a time of alignment with said mask for forming said mask circuit patterns thereon, second alignment marks used at a time of alignment with a substrate to be exposed for forming circuit patterns thereon, said method comprising the step of:

forming all of said first alignment marks and said second alignment marks on said mask at one time;
wherein the alignment with said mask for forming said first alignment marks and said second alignment marks thereon at one time is performed by using a scanner type exposure system with a projected magnification of a 1:1 ratio or a low reduction ratio.

28. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, said supporting region having first alignment marks used at a time of alignment with said mask for forming said mask circuit patterns thereon, second alignment marks being used at a time of alignment with a substrate to be exposed for forming circuit patterns thereon, said method comprising the step of:

dividing all of said first alignment marks and said second alignment marks to be formed on said mask into a plurality of groups each containing pluralities of said first alignment marks and said second alignment marks and sequentially forming said first alignment marks and said second alignment marks on said mask by sequential exposure performed for each of said pluralities of groups.

29. A method of making a mask according to claim 28, wherein each relative distance between two of said plurality of groups is obtained by measuring each relative distance between said first alignment marks located in the two of said plurality of groups and each relative distance between said second alignment marks located in the two of said plurality of groups and the exposure by the charged particle beams for forming said mask circuit patterns on said plurality of regions is performed by using said first alignment marks corrected on the basis of the measured results.

30. A method of making a mask according to claim 29, wherein said first alignment marks and said second alignment marks are covered with a protective film before exposure by the charged particle beams.

31. A method of making a mask according to claim 28, wherein said first alignment marks are formed in such a manner that one or more of said first alignment marks are located in a portion of said supporting region around each of said plurality of pattern formation regions, and said second alignment marks are formed in such a manner as to be all located in a portion of said supporting region outside an area formed by said plurality of said pattern formation regions.

32. A method of making a mask according to claim 28, wherein shapes of said first alignment marks are different from those of said second alignment marks.

33. A method of making a mask according to claim 28, wherein said mask is a transmission mask.

34. A method of making a mask according to claim 28, wherein said mask is a stencil mask.

35. A method of making a mask according to claim 33, wherein said first alignment marks and said second alignment marks are formed on an electron scatterer formed on a membrane.

36. A method of making a mask according to claim 33, wherein said first alignment marks and said second alignment marks are formed on an electron scatterer formed on a membrane by selectively removing said electron scatterer.

37. A method of making a mask according to claim 34, wherein said first alignment marks and said second alignment marks are formed on a mask board.

38. A method of making a mask according to claim 34, wherein said first alignment marks and said second alignment marks are formed on a mask board by selectively removing said mask board.

39. A method of making a mask according to claim 34, wherein said first alignment marks and said second alignment marks are formed on a mask board by selectively removing said mask board to form holes or grooves in said mask board, and burying said holes or grooves with a metal whose atoms have atomic weights heavier than those of atoms of said mask board.

40. A method of making a mask according to claim 39, wherein said metal is platinum, gold, silver, copper, tungsten, tantalum or molybdenum.

41. A method of making a mask, which mask has a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, said supporting region having first alignment marks used at the time of alignment with said mask for forming said mask circuit patterns thereon, second alignment marks being used at a time of alignment with a substrate to be exposed for forming circuit patterns thereon, said second alignment marks being used for alignment with a substrate to be exposed by a charged particle beam reduction-and-division transfer exposure system by using said second alignment marks, said method comprising the steps of:

performing alignment with a substrate to be exposed by said charged particle beam reduction-and-division transfer exposure system by using a test mask having a positional deviation measurement pattern, to dividedly transfer said positional deviation measurement pattern on said substrate at a specific reduction ratio;

obtaining a positional deviation amount of said charged particle beam reduction-and-division transfer exposure system upon exposure and a correction amount for correcting the positional deviation amount by using the positional deviation measurement pattern which has been dividedly transferred on said substrate at the specific reduction ratio; and performing alignment with said mask for forming said mask circuit patterns while correcting said mask circuit patterns by the correction amount for the positional deviation so as to correct the positional deviation amount of said charged particle beam reduction-and-division transfer exposure system, to thereby correct said mask.

42. An exposure process comprising the steps of:

producing a mask having a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, said supporting region having first alignment marks used at the time of alignment with said mask for forming said mask circuit patterns thereon, second alignment marks being used at a time of alignment with a substrate to be exposed for forming circuit patterns thereon; and performing alignment with a substrate to be exposed by a charged particle beam reduction-and-division transfer exposure system using said second alignment marks formed on said mask wherein, a substrate to be exposed is exposed by said charged particle beam reduction-and-division transfer exposure system by using a test mask having a positional deviation measurement pattern, to dividedly transfer said positional deviation measurement pattern on said substrate at a specific reduction ratio;

a positional deviation amount of said charged particle beam reduction-and-division transfer exposure system upon exposure and a correction amount for correcting the positional deviation amount are obtained by using the positional deviation measurement pattern which has been dividedly transferred on said substrate at the specific reduction ratio;

alignment with said mask for forming said mask circuit patterns thereon while correcting said mask circuit patterns by the correction amount for the positional deviation is performed so as to correct the positional deviation amount of said charged particle beam reduction-and-deviation transfer exposure system, to thereby correct said mask; and alignment with a substrate to be exposed by said charged particle beam reduction-and-division transfer exposure system is performed by using said corrected mask.

43. An exposure process according to claim 42, wherein a substrate to be exposed is exposed by each of a plurality of charged particle beam reduction-and-division transfer exposure systems by using the same test mask having a positional deviation measurement pattern, to dividedly transfer said positional deviation measurement pattern on said substrate at a specific reduction ratio;

a positional deviation amount of each of said plurality of charged particle beam reduction-and-deviation transfer exposure systems upon exposure and a correction amount for correcting the positional deviation amount are obtained by using the positional deviation measurement pattern which has been dividedly transferred on said substrate at the specific reduction ratio;

alignment with said mask for forming said mask circuit patterns thereon while correcting said mask circuit patterns by the correction amount for the positional deviation is performed so as to correct the positional deviation of each of said plurality of charged particle beam reduction-and-division transfer exposure systems, to thereby correct said mask for each of said plurality of charged particle beam reduction-and-division transfer exposure systems; and, alignment with a substrate to be exposed is performed by said plurality of charged particle beam reduction-and-division transfer exposure systems using said corrected masks.

44. A method of fabricating a semiconductor device comprising:

a plurality of exposure steps in each of which alignment with a semi-conductor substrate is performed by a charged particle beam reduction-and-division transfer exposure system using a plurality of masks, each of said masks having a plurality of pattern formation regions in which mask circuit patterns are formed, and a supporting region in which any mask circuit pattern is not formed, said supporting region being provided for holding said plurality of pattern formation regions while separating said plurality of pattern formation regions from each other, wherein said supporting region has first alignment marks used at a time of alignment with said mask for forming said mask circuit patterns thereon, second alignment marks used at a time of alignment with a substrate to be exposed for forming circuit patterns thereon, said first alignment marks and said second alignment marks are formed on each of said plurality of masks used for said plurality of exposure steps by using the same master mask.

* * * * *